US008375376B2

(12) United States Patent
Wakabayashi

(10) Patent No.: US 8,375,376 B2
(45) Date of Patent: Feb. 12, 2013

(54) DESCRIPTION PROCESSING DEVICE, DESCRIPTION PROCESSING METHOD, AND RECORDING MEDIUM

(75) Inventor: Kazutoshi Wakabayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 992 days.

(21) Appl. No.: 12/413,138

(22) Filed: Mar. 27, 2009

(65) Prior Publication Data

US 2009/0248386 A1 Oct. 1, 2009

(30) Foreign Application Priority Data

Mar. 31, 2008 (JP) ................................. 2008-092209

(51) Int. Cl.
*G06F 9/45* (2006.01)
*G06F 17/50* (2006.01)

(52) U.S. Cl. ........ 717/152; 717/136; 717/159; 716/103; 716/104

(58) Field of Classification Search ........................ None
See application file for complete search history.

(56) References Cited

U.S. PATENT DOCUMENTS

| | | | | | |
|---|---|---|---|---|---|
| 4,567,574 | A | * | 1/1986 | Saade et al. | 717/155 |
| 5,414,855 | A | * | 5/1995 | West | 717/158 |
| 5,450,554 | A | * | 9/1995 | Zaiki | 717/156 |
| 5,623,417 | A | * | 4/1997 | Iwasaki et al. | 716/102 |
| 5,832,272 | A | * | 11/1998 | Kalantery | 717/149 |
| 5,966,534 | A | * | 10/1999 | Cooke et al. | 717/155 |
| 5,987,239 | A | * | 11/1999 | Kirsch | 716/102 |
| 6,341,372 | B1 | * | 1/2002 | Datig | 717/136 |
| 6,360,355 | B1 | * | 3/2002 | Nishida et al. | 716/103 |
| 6,539,537 | B1 | * | 3/2003 | Maruyama et al. | 716/105 |
| 6,820,257 | B2 | * | 11/2004 | Boca et al. | 717/155 |
| 7,000,213 | B2 | * | 2/2006 | Banerjee et al. | 716/103 |
| 7,219,342 | B2 | * | 5/2007 | Metzgen | 717/156 |
| 7,412,684 | B2 | * | 8/2008 | Gutberlet et al. | 716/101 |
| 7,472,371 | B2 | * | 12/2008 | Furukawa | 716/109 |

(Continued)

FOREIGN PATENT DOCUMENTS

| | | |
|---|---|---|
| JP | H02010429 A | 1/1990 |
| JP | 1993334391 A | 12/1993 |

(Continued)

OTHER PUBLICATIONS

Wakabayashi Kazutoshi, C-based Synthesis Experiences with a Behavior Synthesizer, "Cyber", Design, Automation and Test in Europe Conference and Exhibition 1999. Proceedings, pp. 1-4.*

(Continued)

*Primary Examiner* — Tuan Q Dam
*Assistant Examiner* — Zheng Wei

(57) ABSTRACT

A description processing device has: a receiving unit which receives a behavior level description; a label-name generating unit which generates a label name; a label disposing unit which disposes a top label statement; an extracting unit which extracts an extracted label statement, a variable-name generating unit which generates a variable name; a replacing unit which replaces a statement immediately below the top label statement to the extracted label statement by a column of a conditional executable statement and an operation/assignment statement and replaces a jump statement for jumping to the extracted label statement by a column of an operation/assignment statement and a jump statement for jumping to the top label; a control unit which repeats the extraction, the generation of a new variable name, and the replacement; an inserting unit which inserts an operation/assignment statement; and an output unit which outputs the behavior level description.

9 Claims, 12 Drawing Sheets

U.S. PATENT DOCUMENTS

| | | | | |
|---|---|---|---|---|
| 7,814,468 | B1 * | 10/2010 | Song et al. | 717/160 |
| 2004/0019883 | A1 * | 1/2004 | Banerjee et al. | 717/152 |
| 2006/0288337 | A1 * | 12/2006 | Nishi | 717/136 |
| 2008/0005705 | A1 * | 1/2008 | Furukawa | 716/3 |

FOREIGN PATENT DOCUMENTS

| | | |
|---|---|---|
| JP | 1993334466 A | 12/1993 |
| JP | H05334466 A | 12/1993 |
| JP | 2007272671 A | 10/2007 |

OTHER PUBLICATIONS

Knapp et al., Behavioral Synthesis Methodology for HDL-Based Specification and Validation, published ACM 1995, pp. 1-7.*

K. Wakabayashi et al. "Global Scheduling Independent of Control Dependencies based on Condition Vectors", 29th ACM/IEEE Design Automation Conference, p. 112-115, 1992.

Japanese Office Action for JP2008-092209 mailed on May 15, 2012.

Muneo Moro, Structured Programing, C MAGAZINE, Softbank Publishing Incorporated, May 1, 2004, vol. 16, No. 5, p. 20-35.

Eiko kanefuji and Others, Positive and Negative side of Goto Sentence in exiting from multiple loop: from a Viewpoint of Hoare Logic, Journal of Information Processing Society of Japan Paper, Information Processing Society of Japan, Mar. 15, 2004, vol. 45, No. 3, p. 770-784.

* cited by examiner

FIG.4A

```
1:foo() {
2:  x = a + b;
3:  y = c + d;
4:L1:
5:  x = x + 3;
6:  z = s + t;
7:L2:
8:  x1 = a - 1;
9:  z = x1 + 1;
20: goto L1;
30: goto L2;
40: goto L1;
50:}
```

FIG.4B

```
1:foo() {
2:START:
3:  x = a + b;
4:  y = c + d;
5:L1:
6:  x = x + 3;
7:  z = s + t;
8:L2:
9:  x1 = a - 1;
10: z = x1 + 1;
20: goto L1;
30: goto L2;
40: goto L1;
50:}
```

TOP LABEL STATEMENT "START:" IS DISPOSED

STATEMENT IMMEDIATELY BELOW TOP LABEL "START:" TO EXTRACTED LABEL STATEMENT "L1:"

FIG.4C

```
1:foo() {
2:START:
3:  if(F1 == 0) {
4:    x = a + b;
5:    y = c + d;
6:  }
7:  F1 = 0;
8:  x = x + 3;
9:  z = s + t;
10:L2:
11: x1 = a - 1;
12: z = x1 + 1;
20: goto L1;
30: goto L2;
40: goto L1;
50:}
```

STATEMENT IMMEDIATELY BELOW TOP LABEL STATEMENT "START:" TO IMMEDIATELY ABOVE EXTRACTED LABEL "L1:"

OPERATION/ASSIGNMENT STATEMENT WHICH ASSIGNS FIRST VALUE "0" TO VARIABLE OF GENERATED VARIABLE NAME "F1"

JUMP STATEMENTS WHICH CAUSE A JUMP TO LABEL OF EXTRACTED LABEL STATEMENT "L1:"

FIG.5A

```
 1: foo() {
 2: START:
 3:   if(F1 == 0) {
 4:     x = a + b;
 5:     y = c + d;
 6:   }
 7:   F1 = 0;
 8:   x = x + 3;
 9:   z = s + t;
10: L2:
11:   x1 = a - 1;
12:   z = x1 + 1;
20:   F1 = 1;
21:   goto START;
30:   goto L2;
40:   F1 = 1;
41:   goto START;
50: }
```

- OPERATION/ASSIGNMENT STATEMENTS WHICH ASSIGN SECOND VALUE "1" TO VARIABLE OF GENERATED VARIABLE NAME "F1"
- JUMP STATEMENTS WHICH CAUSE A JUMP TO TOP LABEL "START"

FIG.5B

```
 1: foo() {
 2: START:
 3:   if(F2 == 0) {
 4:     if(F1 == 0) {
 5:       x = a + b;
 6:       y = c + d;
 7:     }
 8:     F1 = 0;
 9:     x = x + 3;
10:     z = s + t;
11:   }
12:   F2 = 0;
13:   x1 = a - 1;
14:   z = x1 + 1;
20:   F1 = 1;
21:   goto START;
30:   F2 = 1;
31:   goto START;
40:   F1 = 1;
41:   goto START;
50: }
```

FIG.5C

```
 1: foo() {
 2:   F1 = 0;
 3:   F2 = 0;
 4: START:
 5:   if(F2 == 0) {
 6:     if(F1 == 0) {
 7:       x = a + b;
 8:       y = c + d;
 9:     }
10:     F1 = 0;
11:     x = x + 3;
12:     z = s + t;
13:   }
14:   F2 = 0;
15:   x1 = a - 1;
16:   z = x1 + 1;
20:   F1 = 1;
21:   goto START;
30:   F2 = 1;
31:   goto START;
40:   F1 = 1;
41:   goto START;
50: }
```

- OPERATION/ASSIGNMENT STATEMENT INITIALIZING VARIABLE OF GENERATED VARIABLE NAME "F1" TO FIRST VALUE "0"
- OPERATION/ASSIGNMENT STATEMENT INITIALIZING VARIABLE OF GENERATED VARIABLE NAME "F2" TO FIRST VALUE "0"

FIG.8A

```
1: bar() {
2:   x = a + b;
3: L1:
4:   y = c + d;
5:   if(cond_exp) {
6:     x = x + 3;
7:     z = s + t;
8: L2:
9:     x1 = a - 1;
10:    z = x1 + 1;
11:  }
20:  goto L1;
30:  goto L2;
50: }
```

FIRST CONDITIONAL EXECUTABLE STATEMENT ENCLOSING EXTRACTED LABEL STATEMENT "L2:" → (lines 5–11)

FIG.8B

```
1: bar() {
2:   x = a + b;
3: L1:
4:   y = c + d;
5:   varL2 = 0;
6: L2:
7:   if(cond_exp || varL2 == 1) {
8:     if(varL2 == 0) {
9:       x = x + 3;
10:      z = s + t;
11:    }
12:    varL2 = 0;
13:    x1 = a - 1;
14:    z = x1 + 1;
15:  }
20:  goto L1;
30:  goto L2;
50: }
```

OPERATION/ASSIGNMENT STATEMENT ASSIGNING FIRST VALUE "0" TO VARIABLE OF GENERATED VARIABLE NAME "varL2" → (line 5)

EXTRACTED LABEL STATEMENT "L2:" → (line 6)

STATEMENTS ABOVE EXTRACTED LABEL STATEMENT "L2:" AMONG STATEMENTS ENCLOSED BY FIRST CONDITIONAL EXECUTABLE STATEMENT → (lines 9–11)

OPERATION/ASSIGNMENT STATEMENT ASSIGNING FIRST VALUE "0" TO VARIABLE OF GENERATED VARIABLE NAME "varL2" → (line 12)

STATEMENTS BELOW EXTRACTED LABEL STATEMENT "L2:" AMONG STATEMENTS ENCLOSED BY FIRST CONDITIONAL EXECUTABLE STATEMENT → (lines 13–14)

JUMP STATEMENT WHICH CAUSES A JUMP TO LABEL OF EXTRACTED LABEL STATEMENT "L2:" → (line 30)

FIG.9

```
1: bar () {
2:   x = a + b;
3: L1:
4:   y = c + d;
5:   varL2 = 0;
6: L2:
7:   if(cond_exp || varL2 == 1) {
8:     if(varL2 == 0) {
9:       x = x + 3;
10:      z = s + t;
11:    }
12:    varL2 = 0;
13:    x1 = a - 1;
14:    z = x1 + 1;
15:  }

20:  goto L1;

30:  varL2 = 1;
31:  goto L2;

50: }
```

OPERATION/ASSIGNMENT STATEMENT ASSIGNING SECOND VALUE "1" TO VARIABLE OF GENERATED VARIABLE NAME "varL2"

JUMP STATEMENT WHICH CAUSES A JUMP TO LABEL OF EXTRACTED LABEL STATEMENT "L2:"

FIG.12A

```
 1:foo() {
 2:   x = a + b;
 3:   y = c + d;
 4:   if(cond_exp) {
 5:     x = x + 3;
 6:     z = s + t;
 7:   } else {
 8:     x1 = a - 1;
 9:     z = x1 + 1;
10:   }
50:}
```

Lines 5–6: STATEMENTS WHICH ARE EXECUTED WHEN CONDITIONAL EXPRESSION "cond_exp" IS TRUE Lines 8–9: STATEMENTS WHICH ARE EXECUTED WHEN CONDITIONAL EXPRESSION "cond_exp" IS FALSE

FIG.12B

```
 1:foo() {
 2:   x = a + b;
 3:   y = c + d;
 4:   if(cond_exp) {
 5:     goto L1;
 6:   }
 7:   x1 = a - 1;
 8:   z = x1 + 1;
 9:   goto L2;
10:L1:
11:   x = x + 3;
12:   z = s + t;
13:L2:
50:}
```

Lines 7–8: STATEMENTS WHICH ARE EXECUTED WHEN CONDITIONAL EXPRESSION "cond_exp" IS FALSE Lines 11–12: STATEMENTS WHICH ARE EXECUTED WHEN CONDITIONAL EXPRESSION "cond_exp" IS TRUE

DESCRIPTION PROCESSING DEVICE, DESCRIPTION PROCESSING METHOD, AND RECORDING MEDIUM

This application is based on Japanese Patent Application No. 2008-092209 filed on Mar. 31, 2008 and including specification, claims, drawings and summary. The disclosure of the above Japanese Patent Application is incorporated herein by reference in its entirety.

BACKGROUND OF THE INVENTION

1. Field of the Invention

The present invention relates to a description processing device and a description processing method suitable for increasing parallelism by converting a behavior level description for designing an electronic circuit, and a recording medium recording program for realizing them on a computer.

2. Description of the Related Art

Because of advance in computer techniques, designing, analysis, evaluation, etc. of semiconductor integrated circuits has been commonly carried out by using a Computer-Aided Design (CAD) system having a behavioral synthesis tool and a logic synthesis tool. For example, Unexamined Japanese Patent Application KOKAI Publication No. 2007-272671 discloses a circuit design supporting system having a behavioral synthesis tool and a logic synthesis tool.

When a semiconductor integrated circuit is to be designed by using the circuit design supporting system, first, a designer prepares a behavior level description including the information necessary for hardware implementation of bit width, etc. of an input port and variables.

Next, by using the behavioral synthesis tool, the designer converts the behavior level description to a Register Transfer Level (RTL) description expressing the logics, which are to be implemented, by registers and logic functions between the registers. Then, the designer converts the RTL description to logic circuits of the gate level by using the logic synthesis tool.

In such design of an electronic circuit, techniques of increasing parallelism by speculatively calculating conditional expressions of conditional branching, THEN part, and ELSE part have been disclosed in, for example, Unexamined Japanese Patent Application KOKAI Publication No. H5-334391, Unexamined Japanese Patent Application KOKAI Publication No. H5-334466, and "Global Scheduling Independent of Control Dependencies based on Condition Vectors," by Kazutoshi Wakabayashi and Hiroshi Tanaka, Proc. of 29th ACM/IEEE Design Automation Conference, pp 112 to 115, 1992, 6 (referred to as "Non-Patent Literature 1").

Even when a label statement declaring a label which is a jump destination of a jump statement is present, there is a demand to constitute a high-speed electronic circuit by applying the techniques disclosed in Non-Patent Literature 1 and increasing parallelism by, for example, deleting or moving the label statement by parallelizing statements in the vicinity of the statement.

SUMMARY OF THE INVENTION

In one aspect of the present invention, a description processing device deletes a label statement from a behavior level description.

Herein, the behavior level description is described by a column of, at least, an operation/assignment statement executing an operation and/or an assignment, a conditional executable statement enclosing and specifying a statement to be executed when a condition is satisfied, the label statement declaring a label, and a jump statement causing a jump to the label.

The description processing device has: a receiving unit, a label-name generating unit, a label disposing unit, an extracting unit, a variable-name generating unit, a replacing unit, a control unit, an inserting unit, and an output unit and is constituted in the below described manner.

First, the receiving unit receives input of the behavior level description serving as a processing target.

Next, the label-name generating unit generates a new label name.

Furthermore, the label disposing unit disposes a label statement using the generated new label name at a top of the received behavior level description (hereinafter, referred to as the "top label statement").

The extracting unit extracts one label statement not enclosed by the conditional executable statement among the statements of the received behavior level description (hereinafter, referred to as the "extracted label statement").

Then, the variable-name generating unit generates a new variable name associated with the extracted label statement.

Next, the replacing unit replaces a statement immediately below the top label statement to the extracted label statement by a column of a conditional executable statement executing the statement immediately below the top label statement to immediately above the extracted label statement when the value of a variable of the generated variable name is a first value and of an operation/assignment statement assigning the first value to the variable of the generated variable name in the input and received behavior level description.

Furthermore, the replacing unit replaces, in the input and received behavior level description, the jump statement causing a jump to the label of the extracted label statement by a column of an operation/assignment statement assigning a second value to the variable of the generated variable name and of a jump statement causing a jump to the top label.

Furthermore, the control unit repeats the extraction by the extracting unit, the generation of a new variable name by the variable-name generating unit, and the replacement by the replacing unit until a predetermined end condition is satisfied.

The inserting unit inserts an operation/assignment statement initializing each variable of the generated variable names to the first value into a part immediately above the label statement using the top label name in a result obtained by last replacement in the repetition.

Then, the output unit outputs the behavior level description which is a result of the insertion.

In another aspect of the present invention, a description processing device moves a label statement of a behavior level description.

Herein, the behavior level description is described by a column of, at least, an operation/assignment statement executing an operation and/or an assignment, a conditional executable statement enclosing and specifying a statement to be executed when a condition is satisfied, a label statement declaring a label, and a jump statement causing a jump to the label.

The description processing device has a receiving unit, an extracting unit, a variable-name generating unit, a replacing unit, a control unit, and an output unit and is constituted in the below described manner.

First, the receiving unit receives input of the behavior level description serving as a processing target.

Next, the extracting unit extracts one label statement (extracted label statement) enclosed by the conditional executable statement among the statements of the received behavior level description.

Then, the variable-name generating unit generates a new variable name associated with the extracted label statement.

The replacing unit replaces the first conditional executable statement enclosing the extracted label statement in the input and received behavior level description by a column of:

(1) an assignment statement assigning a first value to the variable of the generated variable name, (2) the extracted label statement, and (3) a second conditional executable statement enclosing statements to be executed when a condition expression of the first conditional executable statement is satisfied or when the variable of the generated variable name is a second value.

The enclosed statements are a column of:

(a) a third conditional executable statement executing a statement above the extracted label statement among statements enclosed by the first conditional executable statement when the variable of the generated variable name is the first value, (b) an assignment statement of assigning the first value to the variable of the generated variable name, and (c) a statement below the extracted label statement among the statements enclosed by the first conditional executable statement.

Furthermore, the replacing unit replaces, in the input and received behavior level description, the jump statement causing a jump to the label of the extracted label statement by a column of an operation/assignment statement assigning the second value to the variable of the generated variable name and a jump statement causing a jump to the label of the extracted label statement.

Then, the control unit repeats the extraction by the extracting unit, the generation of a new variable name by the variable-name generating unit, and the replacement by the replacing unit until a predetermined end condition is satisfied.

The output unit outputs the behavior level description which is a result obtained by last replacement in the repetition.

Another aspect of the present invention is a description processing method of deleting a label statement from a behavior level description described by a column of, at least, an operation/assignment statement executing an operation and/or an assignment, a conditional executable statement enclosing and specifying a statement to be executed when a condition is satisfied, a label statement declaring a label, and a jump statement causing a jump to the label.

The description processing method is executed by a description processing device having: a receiving unit, a label-name generating unit, a label disposing unit, an extracting unit, a variable-name generating unit, a replacing unit, a control unit, an inserting unit, and an output unit.

The description processing method includes a receiving step, a label-name generating step, a label disposing step, an extracting step, a variable-name generating step, a replacing step, a control step, an inserting step, and an output step and is constituted in the below described manner.

First, in the receiving step, the receiving unit receives input of the behavior level description serving as a processing target.

Next, in the label-name generating step, the label-name generating unit generates a new label name.

In the label disposing step, the label disposing unit disposes a label statement using the generated new label name (top label statement) at a top of the received behavior level description.

Furthermore, in the extracting step, the extracting unit extracts one label statement (extracted label statement) not enclosed by the conditional executable statement among the statements of the received behavior level description.

Then, in the variable-name generating step, the variable-name generating unit generates a new variable name associated with the extracted label statement.

In the replacing step, the replacing unit replaces a statement immediately below the top label statement to the extracted label statement by a column of a conditional executable statement executing the statement immediately below the top label statement to immediately above the extracted label statement when the value of a variable of the generated variable name is a first value and an operation/assignment statement assigning the first value to the variable of the generated variable name in the input and received behavior level description.

Furthermore, in the replacing step, the replacing unit replaces, in the input and received behavior level description, the jump statement causing a jump to the label of the extracted label statement by a column of an operation/assignment statement assigning a second value to the variable of the generated variable name and a jump statement causing a jump to the top label.

Then, in the control step, the control unit repeats the extraction by the extracting unit, the generation of a new variable name by the variable-name generating unit, and the replacement by the replacing unit until a predetermined end condition is satisfied.

In the inserting step, the inserting unit inserts an operation/assignment statement initializing the each variable of generated variable name to the first value into a part immediately above the top label statement in a result obtained by last replacement in the repetition.

Furthermore, in the output step, the output unit outputs the behavior level description which is a result of the insertion.

In order to achieve the above described object, a description processing method according to another aspect is a description processing method for moving a label statement of a behavior level description described by a column of, at least, an operation/assignment statement executing an operation and/or assignment, a conditional executable statement enclosing and specifying a statement to be executed when a condition is satisfied, the label statement declaring a label, and a jump statement causing a jump to the label.

The description processing method is executed by a description processing device having a receiving unit, an extracting unit, a variable-name generating unit, a replacing unit, a control unit, and an output unit.

The description processing method includes a receiving step, an extracting step, a variable-name generating step, a replacing step, a control step, and an output step and is configured in the below described manner.

First, in the receiving step, the receiving unit receives input of the behavior level description serving as a processing target.

Next, in the extracting step, the extracting unit extracts one label statement (extracted label statement) enclosed by the conditional executable statement among the statements of the received behavior level description.

Then, in the variable-name generating step, the variable-name generating unit generates a new variable name associated with the extracted label statement.

In the replacing step, the replacing unit replaces the first conditional executable statement enclosing the extracted label statement in the input and received behavior level description by a column of:

(1) an assignment statement assigning a first value to the variable of the generated variable name, (2) the extracted label statement, and (3) a second conditional executable statement enclosing statements to be executed when a condition expression of the first conditional executable statement is satisfied or when the variable of the generated variable name is a second value.

The enclosed statements are a column of:

(a) a third conditional executable statement executing a statement above the extracted label statement among statements enclosed by the first conditional executable statement when the variable of the generated variable name is the first value, (b) an assignment statement of assigning the first value to the variable of the generated variable name, and (c) a statement below the extracted label statement among the statements enclosed by the first conditional executable statement.

Furthermore, in the replacing step, the replacing unit replaces, in the input and received behavior level description, the jump statement causing a jump to the label of the extracted label statement by a column of an operation/assignment statement assigning the second value to the variable of the generated variable name and a jump statement causing a jump to the label of the extracted label statement.

Then, in the control step, the control unit repeats the extraction by the extracting unit, the generation of a new variable name by the variable-name generating unit, and the replacement by the replacing unit until a predetermined end condition is satisfied.

In the output step, the output unit outputs the behavior level description which is a result obtained by last replacement in the repetition.

Another aspect of the present invention is a recording medium recording a program for causing a computer to function as a description processing device which deletes a label statement from a behavior level description.

Herein, the behavior level description is described by a column of, at least, an operation/assignment statement executing an operation and/or assignment, a conditional executable statement enclosing and specifying a statement to be executed when a condition is satisfied, the label statement declaring a label, and a jump statement causing a jump to the label.

The description processing device has: a receiving unit, a label-name generating unit, a label disposing unit, an extracting unit, a variable-name generating unit, a replacing unit, a control unit, an inserting unit, and an output unit and is constituted in the below described manner.

First, the receiving unit receives input of the behavior level description serving as a processing target.

Next, the label-name generating unit generates a new label name.

Furthermore, the label disposing unit disposes a label statement using the generated new label name (top label statement) at a top of the received behavior level description.

The extracting unit extracts one label statement (extracted label statement) not enclosed by the conditional executable statement among the statements of the received behavior level description.

Then, the variable-name generating unit generates a new variable name associated with the extracted label statement.

Next, the replacing unit replaces a statement immediately below the top label statement to the extracted label statement by a column of a conditional executable statement executing the statement immediately below the top label statement to immediately above the extracted label statement when the value of a variable of the generated variable name is a first value, and an operation/assignment statement assigning the first value to the variable of the generated variable name in the input and received behavior level description.

Furthermore, the replacing unit replaces, in the input and received behavior level description, the jump statement causing a jump to the label of the extracted label statement by a column of an operation/assignment statement assigning a second value to the variable of the generated variable name and a jump statement causing a jump to the top label.

Furthermore, the control unit repeats the extraction by the extracting unit, the generation of a new variable name by the variable-name generating unit, and the replacement by the replacing unit until a predetermined end condition is satisfied.

The inserting unit inserts an operation/assignment statement initializing each variable of the generated variable name to the first value into a part immediately above the label statement using the top label name in a result obtained by last replacement in the repetition.

Then, the output unit outputs the behavior level description which is a result of the insertion.

Another aspect of the present invention is a recording medium recording a program for causing a computer to function as a description processing device which moves a label statement of a behavior level description.

Herein, the behavior level description is described by a column of, at least, an operation/assignment statement executing an operation and/or assignment, a conditional executable statement enclosing and specifying a statement to be executed when a condition is satisfied, a label statement declaring a label, and a jump statement causing a jump to the label.

The description processing device has a receiving unit, an extracting unit, a variable-name generating unit, a replacing unit, a control unit, and an output unit and is constituted in the below described manner.

First, the receiving unit receives input of the behavior level description serving as a processing target.

Next, the extracting unit extracts one label statement (extracted label statement) enclosed by the conditional executable statement among the statements of the received behavior level description.

Then, the variable-name generating unit generates a new variable name associated with the extracted label statement.

The replacing unit replaces the first conditional executable statement enclosing the extracted label statement in the input and received behavior level description by a column of:

(1) an assignment statement assigning a first value to the variable of the generated variable name, (2) the extracted label statement, and (3) a second conditional executable statement enclosing statements to be executed when a condition expression of the first conditional executable statement is satisfied or when the variable of the generated variable name is a second value.

The enclosed statements are a column of:

(a) a third conditional executable statement executing a statement above the extracted label statement among statements enclosed by the first conditional executable statement when the variable of the generated variable name is the first value, (b) an assignment statement of assigning the first value to the variable of the generated variable name, and (c) a statement below the extracted label statement among the statements enclosed by the first conditional executable statement.

Furthermore, the replacing unit replaces, in the input and received behavior level description, the jump statement causing a jump to the label of the extracted label statement by a column of an operation/assignment statement assigning the second value to the variable of the generated variable name and a jump statement causing a jump to the label of the extracted label statement.

Then, the control unit repeats the extraction by the extracting unit, the generation of a new variable name by the variable-name generating unit, and the replacement by the replacing unit until a predetermined end condition is satisfied.

The output unit outputs the behavior level description which is a result obtained by last replacement in the repetition.

BRIEF DESCRIPTION OF THE DRAWINGS

These objects and other objects and advantages of the present invention will become more apparent upon reading of the following detailed description and the accompanying drawings in which:

FIGS. 4A to 4C show examples of a behavior level description in respective stages of the label deleting process;

FIGS. 5A to 5C show examples of the behavior level description in respective stages of the label deleting process;

FIGS. 8A and 8B show examples of a behavior level description in respective stages of the label moving process;

FIG. 9 is an example of the behavior level description in each stage of the label moving process;

FIG. 12A shows an example of a behavior level description supplied to a preprocessing unit; and FIG. 12B shows an example of the behavior level description output from the preprocessing unit.

DETAILED DESCRIPTION OF THE PREFERRED EMBODIMENTS

First Embodiment

Hereinafter, a description processing device according to a first embodiment will be explained with reference to drawings.

First, a configuration of the description processing device 100 according to the present embodiment will be explained with reference to FIG. 1. The description processing device 100 is a device which converts a behavior level description which includes the information necessary for hardware implementation of bit widths, etc. of an input port and variables and is described in, for example, the System C language to a behavior level description which enhances the parallelism of a generated electronic circuit. More specifically, the description processing device 100 executes a process of deleting labels which are not enclosed by conditional executable statements from the behavior level description (hereinafter, referred to as a "label deleting process").

Figure 1:
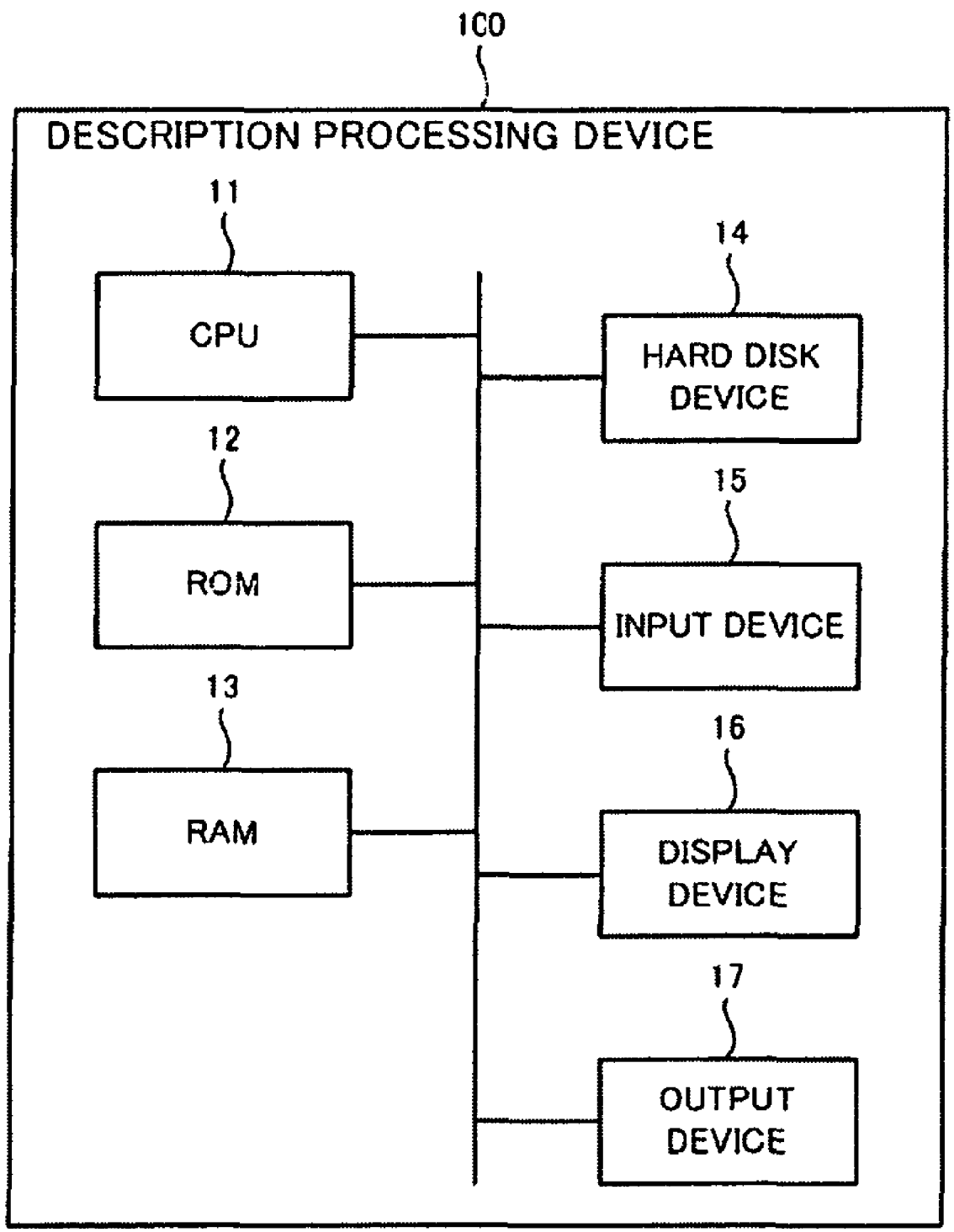
FIG. 1 is a block diagram showing a configuration of a description processing device according to an embodiment of the present invention.

As shown in FIG. 1, the description processing device 100 physically has: a Central Processing Unit (CPU) 11, a Read Only Memory (ROM) 12, a Random Access memory (RAM) 13, a hard disk device 14, an input device 15, a display device 16, and an output device 17. The constituent elements that the description processing device 100 has are mutually connected via a bus.

The CPU 11 controls overall operations of the description processing device 100 in accordance with programs stored in the hard disk device 14. The CPU 11 is connected to the constituent elements via the bus and transmits and receives control signals and data.

The ROM 12 stores Initial Program Loader (IPL), which is executed immediately after power is turned on. After IPL is executed, the CPU 11 retrieves the programs stored in the hard disk device 14 to the RAM 13 and executes them.

The RAM 13 temporarily stores data and programs. The RAM 13 temporarily stores, for example, the programs retrieved from the hard disk device 14 and the data necessary for the label deleting process.

The hard disk device 14 stores the programs which are executed by the CPU 11. The hard disk device 14 also stores, for example, a behavior level description in which labels are to be deleted and a behavior level description obtained by the label deleting process.

Under the control of the CPU 11, the input device 15 receives input of, for example, parameters necessary for the label deleting processes from a user and receives requests such as an initiation request of the label deleting process from a user. The input device 15 comprises, for example, a keyboard and a mouse.

Under the control of the CPU 11, the display device 16 displays, for example, a screen for receiving input of, for example, the parameters and requests such as the label deleting process initiation request from the user and a screen for displaying the behavior level description. The display device 16 comprises, for example, a liquid crystal display device.

Under the control of the CPU 11, the output device 17 outputs, for example, the behavior level description obtained by the label deleting processes. The output device 17 comprises, for example, a general-purpose communication interface, such as a USB port, and a digital output port.

Next, the configuration of the description processing device 100 according to the present embodiment will be explained.

Figure 2:
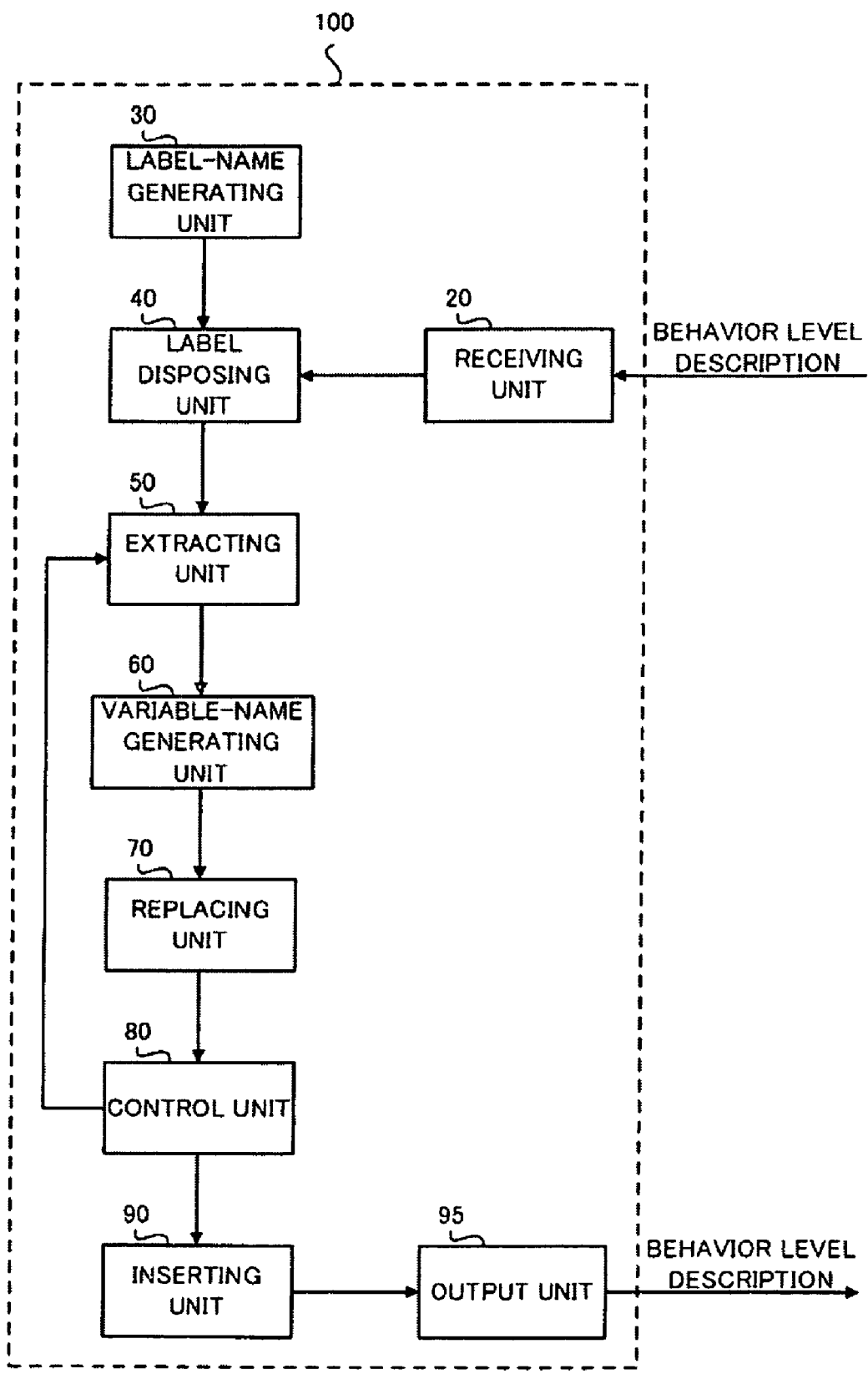
FIG. 2 is a block diagram showing a basic configuration of the description processing device according to a first embodiment.

FIG. 2 is a block diagram showing a basic configuration of the description processing device 100 according to the present embodiment. As shown in FIG. 2, in terms of functions, the description processing device 100 has: a receiving unit 20, a label-name generating unit 30, a label disposing unit 40, an extracting unit 50, a variable-name generating unit 60, a replacing unit 70, a control unit 80, an inserting unit 90, and an output unit 95.

The receiving unit 20 receives input of the behavior level description which is described by the column of, at least, an operation/assignment statement which executes an operation and/or assignment, a conditional executable statement which encloses and specifies a statement to be executed when a condition is satisfied, a label statement which declares a label, and a jump statement which causes a jump to the label. The CPU 11 cooperates with the ROM 12, the RAM 13, and the input device 15, thereby realizing the receiving unit 20.

The label-name generating unit 30 generates new label names. The CPU 11 cooperates with the ROM 12 and the RAM 13, thereby realizing the label-name generating unit 30.

The label disposing unit 40 disposes a label statement (top label statement), which uses a new generated label name, at the top of the received behavior level description. The CPU 11 cooperates with the ROM 12 and the RAM 13, thereby realizing the label disposing unit 40.

The extracting unit 50 extracts one label statement (extracted label statement), which is not enclosed by the conditional executable statement from among the statements of the received behavior level description. The CPU 11 cooperates with the ROM 12 and RAM 13, thereby realizing the extracting unit 50.

The variable-name generating unit 60 generates a new variable name, which is associated with the extracted label statement. The CPU 11 cooperates with the ROM 12 and the RAM 13, thereby realizing the variable-name generating unit 60.

The replacing unit 70 replaces the statements immediately below the top label statement to the extracted label statement in the input and received behavior level description by the column of a conditional executable statement, which executes the statements immediately below the top label statement to immediately above the extracted label statement when the value of the variable of the generated variable name is a first value, and an operation/assignment statement, which assigns the first value to the variable of the generated variable name.

The replacing unit 70 also replaces the jump statement which causes a jump to the label of the extracted label statement in the input and received behavior level description by the column of an operation/assignment statement, which assigns a second value to the variable of the generated variable name, and a jump statement which causes a jump to the top label. The CPU 11 cooperates with the ROM 12 and the RAM 13, thereby realizing the replacing unit 70.

The control unit 80 repeats the extraction by the extracting unit 50, generation of a variable name by the variable-name generating unit 60, and the replacement by the replacing unit 70 until a predetermined end conditions is satisfied. The CPU 11 cooperates with the ROM 12 and the RAM 13, thereby realizing the control unit 80.

The inserting unit 90 inserts an operation/assignment statement, which initializes each of the variables of the generated variable names to the first value, into the part that is immediately before the top label statement in the result obtained by the last replacement of the repetition. The CPU 11 cooperates with the ROM 12 and the RAM 13, thereby realizing the inserting unit 90.

The output unit 95 outputs the behavior level description which is the result of the insertion of the operation/assignment statement, which carries out initialization to the first value. The CPU 11 cooperates with the ROM 12, the RAM 13, and the output device 17, thereby realizing the output unit 95.

Next, the label deleting process executed by the description processing device 100 according to the present embodiment will be explained in detail with reference to FIG. 3, FIGS. 4A to 4C, and FIGS. 5A to 5C.

Figure 3:
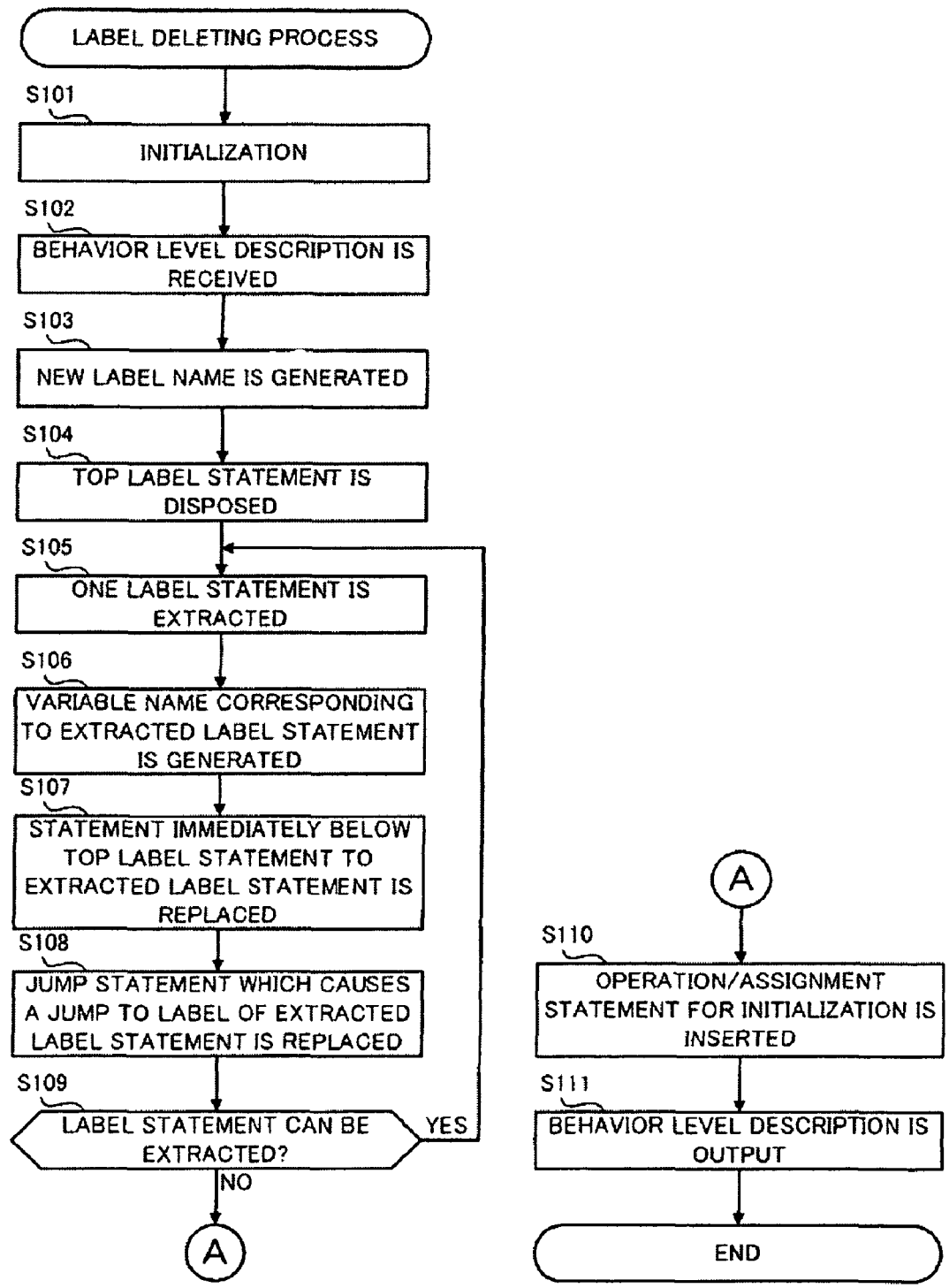
FIG. 3 is a flow chart showing a label deleting process.

FIG. 3 is a flow chart showing an example of the label deleting process executed by the description processing device 100. FIGS. 4A to 4C and FIGS. 5A to 5C show examples of a behavior level description in respective stages of the label deleting process executed by the description processing device 100 respectively.

For example, an initiation request of the label deleting process is received from a user via the input device 15, the description processing device 100 initiates the label deleting process shown in the flow chart of FIG. 3.

First, the description processing device 100 executes initialization (step S101). The description processing device 100 executes, for example, initialization of variables which are stored in the RAM 13 and to be used in the label deleting process.

Then, the receiving unit 20 receives a behavior level description, which is a target of the label deleting process, from the user (step S102). The receiving unit 20 receives, from the user, specification of the behavior level description, which is described by a column of at least: an operation/assignment statement, which executes an operation and/or assignment; a conditional executable statement, which encloses and specifies a statement to be executed when a condition is satisfied; a label statement, which declares a label; and a jump statement which causes a jump to the label. Herein, one statement corresponds to, for example, one row, and the column of the statements corresponds to a plurality of rows.

Herein, the behavior level description, the specification of which is received by the receiving unit 20, includes, as shown in FIG. 4A, operation/assignment statements shown in 2nd, 3rd, 5th, 6th, 8th, and 9th rows, label statements shown in 4th and 7th rows, and jump statements shown in 20th, 30th, and 40th rows. The receiving unit 20, for example, retrieves the behavior level description, which is specified by the user, from the hard disk device 14 and stores the description in the RAM 13.

Next, the label-name generating unit 30 generates a new label name (step S103). The label-name generating unit 30 generates for example, a new label name "START", which is not used in the current behavior level description.

Next, the label disposing unit 40 disposes a top label statement at the top of the received behavior level description (step S104). As shown in FIG. 4B, the label disposing unit 40 disposes the top label statement "START:" at the top (second row) of the behavior level description.

Then, the extracting unit 50 extracts one label statement that is not enclosed by a conditional executable statement among the statements of the received behavior level description (step S105). The extracting unit 5 extracts, as an extracted label, the label statement "L1:" (5th row), which is not enclosed by a conditional executable statement, from the list shown in FIG. 4B. Herein, the conditional executable statement is a statement which includes a conditional statement specifying a predetermined condition and an operation/assignment statement which is executed when the condition is satisfied. For example, in the list of FIG. 4C, "if(F1=0){" (3rd row) is the conditional statement, "x=a+b" (4th row) and "y=c+d" (5th row) are the operation/assignment statements, and "if(F1==0){" (3rd row) to "}" (6th row) are the conditional executable statements.

Note that, in the list shown in FIG. 4B, a label statement "L2:" (8th row) is also present as another label statement; however, at this point, merely one label statement is extracted. The label statement to be extracted by the extracting unit 50 is arbitrarily selected, for example, the smaller the number of the rows in which the label statements are disposed, the more preferentially they are extracted.

Next, the variable-name generating unit 60 generates a new variable name associated with the extracted label statement (step S106). The variable-name generating unit 60 generates a variable name "F1" as the new variable name associated with the extracted label statement "L1:".

Then, the replacing unit 70 replaces the statement immediately below the top label statement to the extracted label statement (step S107). In the list shown in FIG. 4B, the replacing unit 70 replaces the statement "x=a+b" (3rd row) immediately below the top label statement "START:" to the extracted label statement "L1:" (5th row) by two statements (1) and (2) shown below (hereinafter, a statement includes a statement of two or more rows).

The statement (1) is a statement which executes the statement "x=a+b" (3rd row) immediately below the top label statement to "y=c+d" (4th row) immediately above the extracted label statement "L1:" (5th row) when the value of the variable "F1" of the generated variable name is a first value, for example, "0". The statement (2) is an operation/assignment statement "F1=0;" which assigns the first value "0" to the variable "F1" of the generated variable name. The list of the behavior level description after the statement immediately below the top label statement to the extracted label statement are replaced by the replacing unit 70 is shown in FIG. 4C.

The replacing unit 70 also replaces jump statements which cause jumps to the label of the extracted label statement (step S108). The replacing unit 70 replaces the jump statements "goto L1;" (20th and 40th rows) which causes a jump to the label of the extracted label statement by two statements (3) and (4) shown below.

The statement (3) is an operation/assignment statement "F1=1;" which assigns a second value, for example, "1" to the variable "F1" of the generated variable name. The statement (4) is a jump statement "goto L1;" which causes a jump to the label of the extracted label statement. The list of the behavior level description after the jump statements which cause jumps to the label of the extracted label statement are replaced by the replacing unit 70 is shown in FIG. 5A.

Next, the control unit 80 determines whether a label statement which is not enclosed by a conditional executable statement can be further extracted or not (step S109). The control unit 80 searches the label statement, which is not enclosed by the conditional executable statement, from the top of the behavior level description or causes the extracting unit 50 to search the label statement, which is not enclosed by the conditional executable statement, thereby determining whether the label statement can be further extracted or not.

When the control unit 80 determines that the label statement can be further extracted (YES in step S109), the control unit 80 repeats the extraction by the extracting unit 50 (step S105), the generation of a variable name by the variable-name generating unit 60 (step S106), and the replacement by the replacing unit 70 (steps S107 and S108) until no more label statement is extracted by the extracting unit 50.

In the example shown in FIG. 5A, since a label statement "L2:" (10th row) which has not been extracted yet is present, the control unit 80 executes the process from the extraction by the extracting unit 50 (step S105) to the replacement by the replacing unit 70 (step S108) with respect to the label statement "L2:" too. Also about the label statement "L2:", the list of the behavior level description after the above described process is executed is shown in FIG. 5B.

Meanwhile, when the control unit 80 determines that the label statement cannot be further extracted (NO in step S109), the inserting unit 90 inserts operation/assignment statements for initialization (step S110). The inserting unit 90 inserts the operation/assignment statements "F1=0;" and "F2=0;", which initialize the respective variables "F1" and "F2" of the generated variable names to the first value "0", to the part that is immediately above the top label statement "START:". The list of the behavior level description after the operation/assignment statements for initialization are inserted by the inserting unit 90 is shown in FIG. 5C.

Next, the output unit 95 outputs the behavior level description into which the operation/assignment statements for initialization are inserted by the inserting unit 90 (step S111). When the output unit 95 completes outputting the behavior level description, the label deleting process is completed.

The description processing device 100 according to the present embodiment is capable of deleting the label statements which are not enclosed by the conditional executable statements from the behavior level description. In other words, the behavior level description including the label statements which are not enclosed by the conditional executable statements can be converted to the behavior level description which does not include the label statements which are not enclosed by the conditional executable statements. The behavior level description after the conversion by the description processing device 100 according to the present embodiment has less label statements, and improvement of parallelism can be expected.

Second Embodiment

Next, with reference to drawings, a description processing device according to a second embodiment will be explained. Note that, since the physical configuration of the description processing device 101 according to the present embodiment is approximately the same as the configuration of the description processing device 100 according to the first embodiment, the explanation thereof is omitted. The description processing device 101 is also a device, which converts a behavior level description to a behavior level description capable of enhancing the parallelism of a generated electronic circuit, as well as the above described description processing device 100. However, the description processing device 101 executes a process of moving a label statement which is enclosed by a conditional executable statement in the behavior level description to outside the conditional executable statement (hereinafter, referred to as a "label moving process"). In other words, the description processing device 101 converts the behavior level description including the label statement which is enclosed by the conditional executable statement to a behavior level description which does not include the label which is enclosed by the conditional executable statement.

Hereinafter, a configuration of the description processing device 101 according to the present embodiment will be explained.

Figure 6:
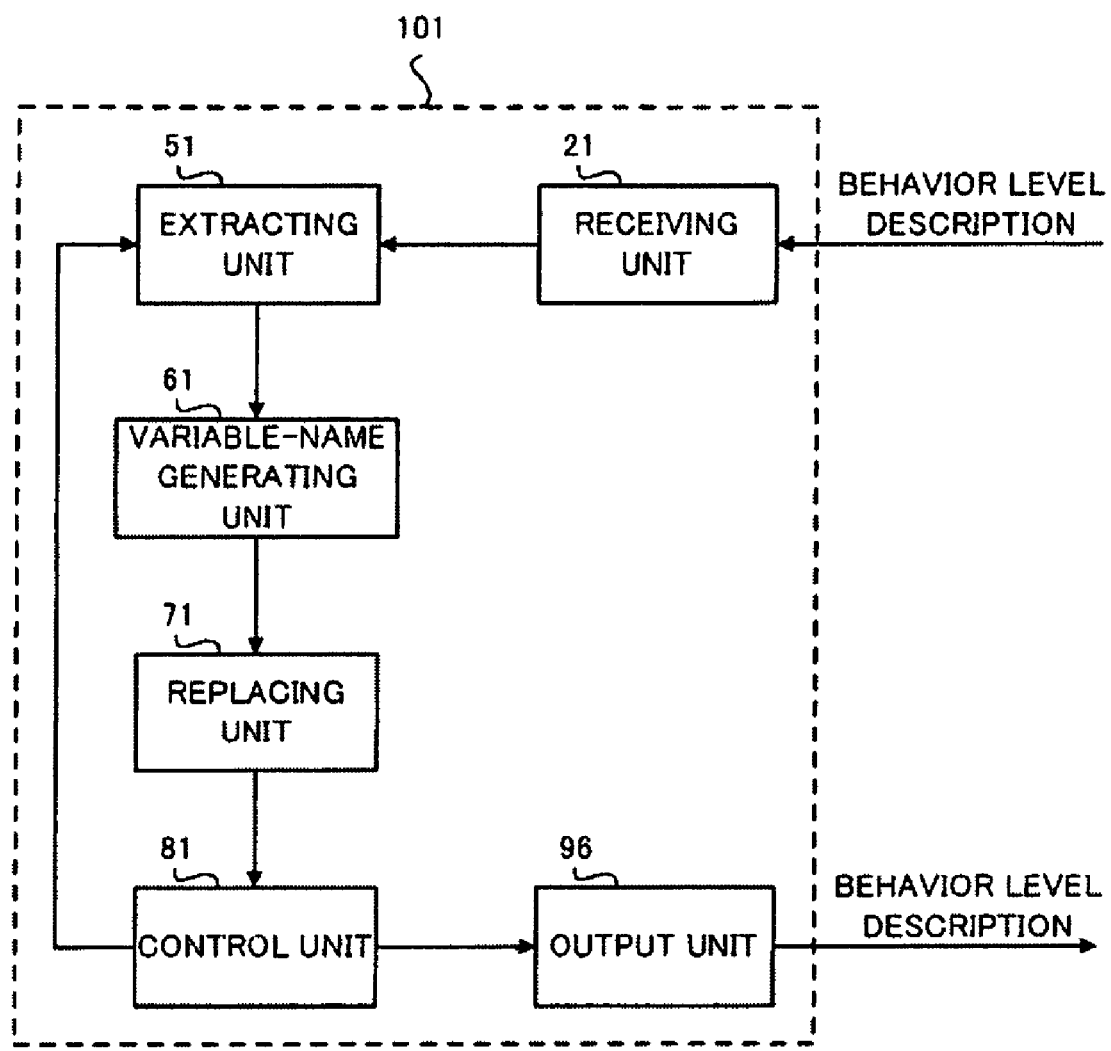
FIG. 6 is a block diagram showing a basic configuration of a description processing device according to a second embodiment.

FIG. 6 is a block diagram showing a basic configuration of the description processing device 101 according to the present embodiment. As shown in FIG. 6, in terms of functions, the description processing device 101 has: a receiving unit 21, an extracting unit 51, a variable-name generating unit 61, a replacing unit 71, a control unit 81, and an output unit 96. Hereinafter, explanations of the constituent elements which are similar to those of the description processing device 100 according to the first embodiment are omitted or simplified.

The receiving unit 21 receives input of a behavior level description. The CPU 11 cooperates with the ROM 12, the RAM 13, and the input device 15, thereby realizing the receiving unit 21.

The extracting unit 51 extracts one label statement (hereinafter, referred to as an "extracted label statement") which is enclosed by a conditional executable statement among the statements of the received behavior level description. The CPU 11 cooperates with the ROM 12 and the RAM 13, thereby realizing the extracting unit 51.

The variable-name generating unit 61 generates a new variable name, which is associated with the extracted label statement. The CPU 11 cooperates with the ROM 12 and the RAM 13, thereby realizing the variable-name generating unit 61.

The replacing unit 71 replaces a first conditional executable statement, which encloses the extracted label statement, in the input and received behavior level description by a column of: (1) an assignment statement, which assigns a first value to the variable of the generated variable name; (2) the extracted label statement; and (3) a second conditional executable statement, which encloses a statement that is to be executed when a conditional expression of a first conditional executable statement is satisfied or when the variable of the generated variable name is a second value.

Note that the enclosed statement is a column of: (a) a third conditional executable statement, which executes the statements above the extracted label statements among the statements enclosed by the first conditional executable statement when the variable of the generated variable name is the first value; (b) an assignment statement, which assigns the first value to the variable of the generated variable name; and (c) the statements below the extracted label statements among the statements enclosed by the first conditional executable statement.

Moreover, the replacing unit 71 further replaces a jump statement which causes a jump to the label of the extracted label statement in the input and received behavior level description by a column of an operation/assignment statement, which assigns the second value to the variable of the generated variable name, and a jump statement which causes a jump to the label of the extracted label statement. The CPU 11 cooperates with the ROM 12 and the RAM 13, thereby realizing the replacing unit 71.

The control unit 81 repeats the extraction by the extracting unit 51, the generation of a variable name by the variable-name generating unit 61, and the replacement by the replacing unit 71 until no more label statement is extracted by the extracting unit 51. The CPU 11 cooperates with the ROM 12 and the RAM 13, thereby realizing the control unit 81.

The output unit 96 outputs a behavior level description which is the result obtained by replacements. The CPU 11 cooperates with the ROM 12, the RAM 13, and the output device 17, thereby realizing the output unit 96.

Next, the label moving process executed by the description processing device 101 according to the present embodiment will be explained in detail with reference to FIG. 7, FIG. 8A, FIG. 8B, and FIG. 9.

Figure 7:
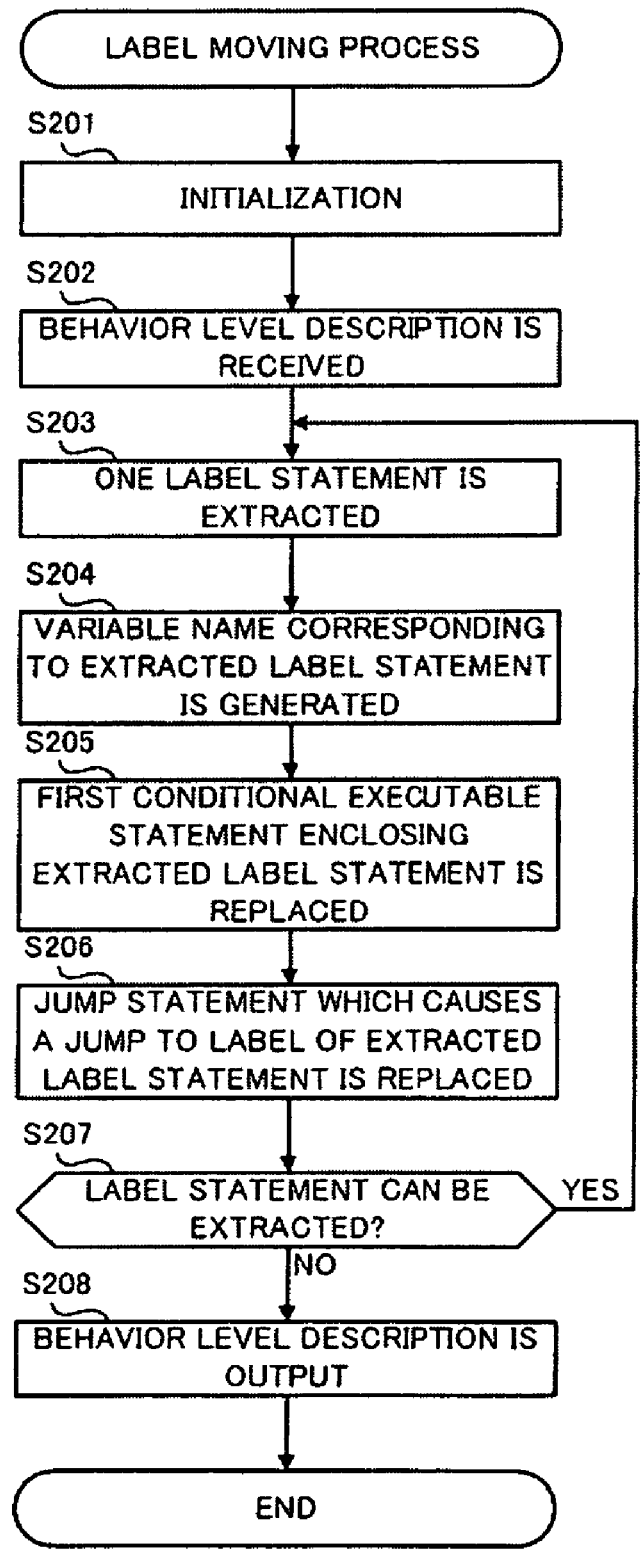
FIG. 7 is a flow chart showing a label moving process.

FIG. 7 is a flow chart showing an example of the label moving process executed by the description processing device 101. FIG. 8A, FIG. 8B, and FIG. 9 show examples of a behavior level description in respective stages of the label moving process executed by the description processing device 101 respectively.

For example, an initiation request of the label moving process is received from a user via the input device 15, the description processing device 101 initiates the label moving process shown in the flow chart of FIG. 7.

First, the description processing device 101 executes initialization (step S201). The description processing device 101 executes, for example, initialization of variables, which are stored in the RAM 13 and to be used in the label moving process.

Then, the receiving unit 21 receives a behavior level description, which is a target of the label moving process, from the user (step S202). The receiving unit 21 receives, from the user, specification of the behavior level description described by a column of, at least: an operation/assignment statement, which executes an operation and/or assignment; a conditional executable statement, which encloses and specifies a statement which is to be executed when a condition is satisfied; a label statement, which declares a label; and a jump statement which causes a jump to the label.

Herein, the behavior level description, the specification of which is received by the receiving unit 21 includes, as shown in FIG. 8A, operation/assignment statements shown in 2nd, 4th, 6th, 7th, 9th, and 10th rows; label statements shown in 3rd and 8th rows; and jump statements shown in 20th and 30th rows. The receiving unit 21, for example, retrieves the behavior level description, which is specified by the user, from the hard disk device 14 and stores the description in the RAM 13.

Next, the extracting unit 51 extracts one label statement that is enclosed by a conditional executable statement among the statements of the received behavior level description (step S203). The extracting unit 51 extracts, as the extracted label, the label statement "L2:" (8th row), which is enclosed by a conditional executable statement, from the list shown in FIG. 8A.

Next, the variable-name generating unit 61 generates a new variable name, which is associated with the extracted label statement (step S204). The variable-name generating unit 61 generates a variable name "valL2" as the new variable name, which is associated with the extracted label statement "L2:".

Then, the replacing unit 71 replaces the first conditional executable statement enclosing the extracted label statement (step S205). In the list shown in FIG. 8A, the replacing unit 71 replaces "if (cond_exp){" (5th row) to "}" (11th row) by the three statements (1), (2), and (3) shown below.

In FIG. 8B, the statement (1) is a statement "valL2=0" (5th row) which assigns a first value, for example, "0" to the variable "valL2" of the generated variable name. The statement (2) is the extracted label statement "L2:" (6th row). Furthermore, the statement (3) is a second conditional executable statement (7th to 15th rows) enclosing three statements (a), (b), and (c) shown below.

The statement (a) is a third conditional executable statement (8th to 11th rows), which executes the statements (9th and 10th rows) above the extracted label statement "L2:" among the statements enclosed by the first conditional executable statement when the variable "valL2" of the generated variable name is the first value, for example "0". The statement (b) is a statement "valL2=0" (12th row), which assigns the first value, for example, "0" to the variable "valL2" of the generated variable name. The statement (c) is the statements (13th and 14th rows) below the extracted label statement "L2:" among the statements enclosed by the first conditional executable statement.

The replacing unit 71 also replaces the jump statement which causes a jump to the label of the extracted label statement (step S206). The replacing unit 71 replaces the jump statement "goto L2;" (30th row) which causes a jump to the label of the extracted label statement by two statements (4) and (5) shown below.

The statement (4) is an operation/assignment statement "valL2=1;", which assigns the second value, for example, "1" to the variable "valL2" of the generated variable name. The statement (5) is a jump statement "goto L2;" which causes a jump to the label of the extracted label statement. The list of the behavior level description after the jump statement which causes a jump to the label of the extracted label statement is replaced by the replacing unit 71 is shown in FIG. 9.

Next, the control unit 81 determines whether a label statement which is enclosed by a conditional executable statement can be further extracted or not (step S207). The control unit 81 searches the label statement, which is enclosed by the conditional executable statement, from the top of the behavior level description or causes the extracting unit 51 to search the label statement, which is enclosed by the conditional executable statement, thereby determining whether the label statement can be further extracted or not.

When the control unit 81 determines that the label statement can be further extracted (YES in step S207), the control unit 81 repeats the extraction by the extracting unit 51 (step S203), the generation of a variable name by the variable-name generating unit 61 (step S204), and the replacement by the replacing unit 71 (steps S205 and S206) until no more label statement is extracted by the extracting unit 51.

In the example shown in FIG. 9, since a label statement which has not been extracted yet is not present, the control unit 81 determines that the label statement cannot be further extracted (NO in step S207).

Finally, the output unit 96 outputs the behavior level description which is the result of the last replacement (step S208). When the output unit 96 completes outputting the behavior level description, the label moving process is completed.

The description processing device 101 according to the present embodiment is capable of moving the label statement, which is enclosed by the conditional executable statement in the behavior level description, to outside the conditional executable statement. In other words, the behavior level description including the label statement which is enclosed by the conditional executable statement can be converted to the behavior level description which does not include the label, which is enclosed by the conditional executable statement. The behavior level description after the conversion by the description processing device 101 according to the present embodiment does not include the label which is enclosed by the conditional executable statement. Therefore, when this behavior level description is processed by the description processing device 100 according to the above described first embodiment, a behavior level description which includes no label except for the top label can be generated. When the behavior level description, which does includes no label except for the top label, is subjected to behavioral synthesis, further improvement of the parallelism can be expected.

Third Embodiment

Next, with reference to drawings, a description processing device according to a third embodiment will be explained. The description processing device 102 according to the third embodiment has the description processing device 100 according to the first embodiment as a label deleting unit 1022 and also has the description processing device 101 according to the second embodiment as a label moving unit 1021.

Herein, the configuration of the description processing device 102 will be briefly explained with reference to FIG. 10, and a behavioral synthesis process using the description processing device 102 will be explained in detail with reference to FIG. 11 and FIG. 12A and FIG. 12B.

Figure 10:
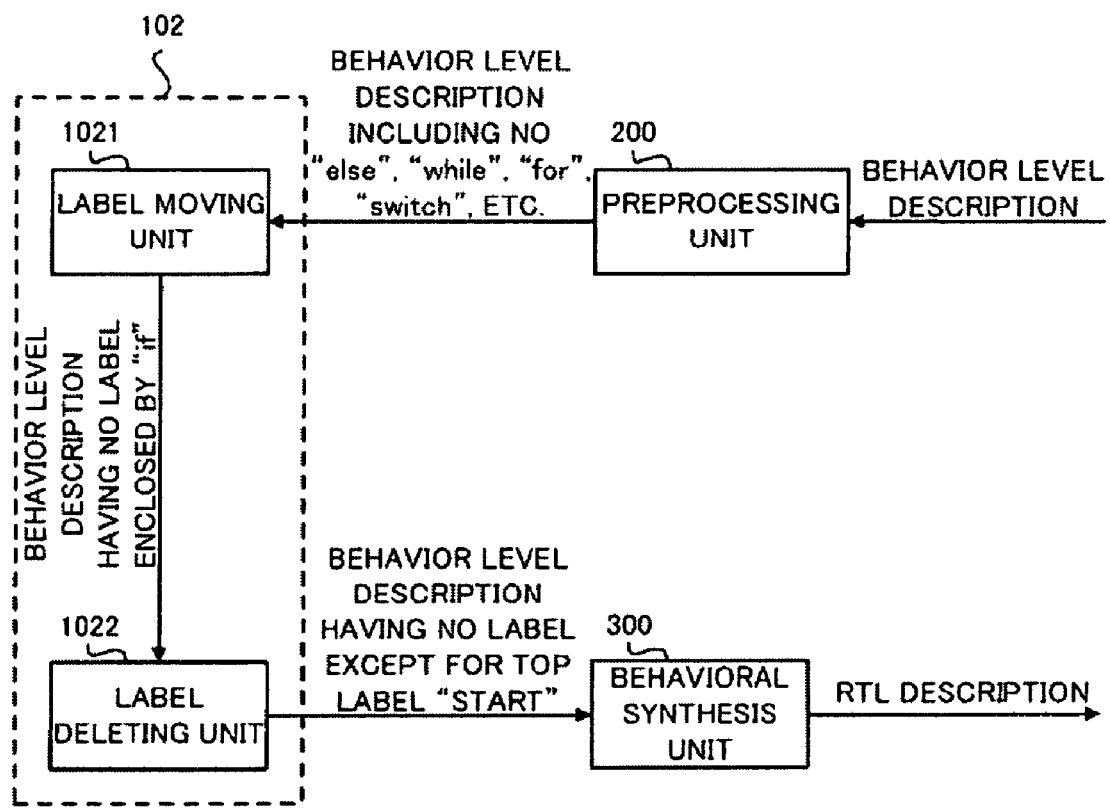
FIG. 10 is a block diagram showing a behavioral synthesis system using a description processing device according to a third embodiment.

First, with reference to FIG. 10, a system of a case in which a behavior level description is subjected to behavioral synthesis by using the description processing device 102 according to the present embodiment will be briefly explained. As shown in FIG. 10, the description processing device 102 has the label deleting unit 1022 and the label moving unit 1021.

The label deleting unit 1022 has a similar configuration as the description processing device 100, and the label moving unit 1021 has a similar configuration as the description processing device 101; therefore, the explanation thereof will be omitted.

Note that a preprocessing unit 200 preprocesses a behavior level description, which is supplied from outside, and supplies the behavior level description, which has been processed, to the label moving unit 1021. A behavioral synthesis unit 300 subjects the behavior level description, which is supplied from the label deleting unit 1022, to behavioral synthesis, thereby generating a Register Transfer Level (RTL) description, which describes the configuration, layout, and wiring of a semiconductor integrated circuit, and outputs the description.

Next, a behavioral synthesis process executed by using the description processing device 102 according to the present embodiment will be explained in detail with reference to FIG. 10, FIG. 11, FIG. 12A, and FIG. 12B.

Figure 11:
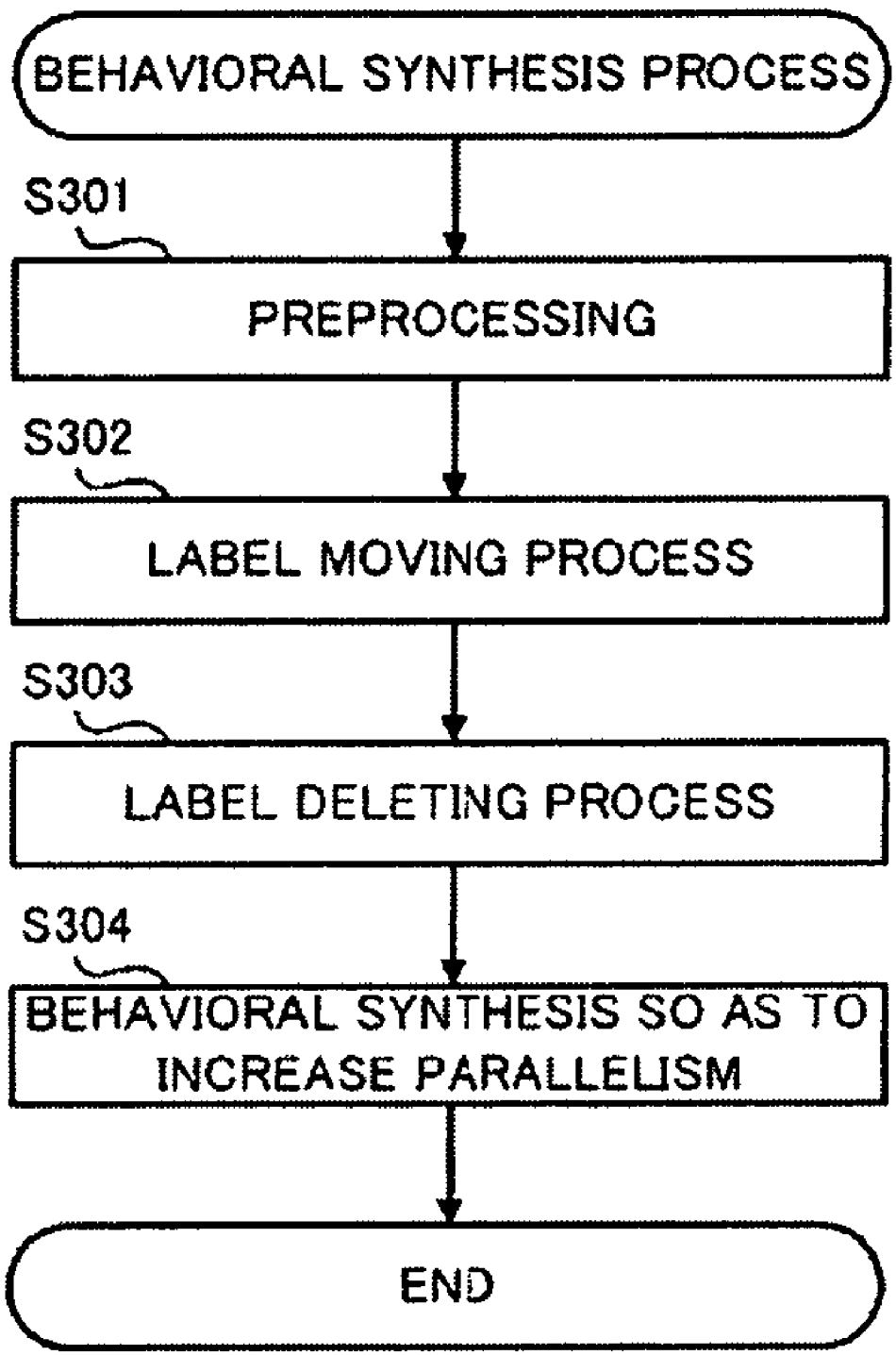
FIG. 11 is a flow chart showing a behavioral synthesis process.

FIG. 11 is a flow chart showing an example of the behavioral synthesis process executed by a behavioral synthesis system, which includes the description processing device 102. FIG. 12A shows an example of the behavior level description supplied to the preprocessing unit 200, and FIG. 12B shows an example of the behavior level description output from the preprocessing unit 200.

For example, when an initiation request of the behavioral synthesis process is received from a user via the input device 15, the behavioral synthesis system initiates the behavioral synthesis process shown in the flow chart of FIG. 11.

First, the preprocessing unit 200 executes preprocessing (step S301). The preprocessing unit 200 converts a supplied behavior level description so that a label moving process and a label deleting process can be smoothly executed in the description processing device 102 and outputs the description.

Specifically, for example, the preprocessing unit 200 converts a conditional executable statement comprising an if statement and an else statement to a conditional executable statement having no else statement. Moreover, for example, the preprocessing unit 200 converts a conditional executable statement comprising a switch statement to a conditional executable statement comprising an if statement. Moreover, for example, the preprocessing unit 200 converts a conditional executable statement comprising a for statement or a while statement to a conditional executable statement comprising an if statement and a goto statement.

An example in which the preprocessing unit 200 converts a conditional executable statement comprising an if statement and an else statement to a conditional executable statement having no else statement will be described by using FIG. 12A and FIG. 12B.

As shown in FIG. 12A, in the behavior level description before carrying out preprocessing, the if statement is described in a 4th row, and the else statement is described in a 7th row. Statements which are executed when a conditional expression "cond_exp" described in the 4th row is true are described in 5th and 6th rows, and statements which are executed when the expression is false are described in 8th and 9th rows.

The preprocessing unit 200 uses goto statements, a label L1, and a label L2, thereby converting them to the description having no else statement. Specifically, as shown in FIG. 12B, the statements which are executed when the conditional expression "cond_exp" is true are replaced by "goto L1;", the else statement is deleted, and "goto L2;" and a label statement "L1:" are sequentially disposed below the statements which are executed when the conditional expression "cond_exp" is false. Then, below the disposed label statement "L1:", the statements which are executed when the conditional expression "cond_exp" is true are disposed; and, further below that, a label statement "L2:" is disposed.

By carrying out the above described replacement, the preprocessing unit 200 converts the conditional executable statement comprising the if statement and the else statement to the conditional executable statement having no else statement. A switch statement, a for statement, and a while statement can be also similarly converted to descriptions using goto statements and if statements.

When the preprocessing unit 200 completes the preprocessing, the label moving unit 1021 executes a label moving process (step S302). Herein, the behavior level description including no else statement, switch statement, for statement, while statement, etc. by virtue of the preprocessing is supplied to the label moving unit 1021. When the description is such a behavior level description, the label moving unit 1021 can execute a label moving process smoothly. Note that, since the label moving process is similar to the process explained by using the flow chart of FIG. 7, the explanation thereof will be omitted.

Next, the label deleting unit 1022 executes a label deleting process (step S303). Herein, the behavior level description including no label that is enclosed by a conditional executable statement is supplied to the label deleting unit 1022. When the description is such a behavior level description, a behavior level description which includes no label except for a top label can be generated. Note that, since the label deleting process is similar to the process explained by using the flow chart of FIG. 3, the explanation thereof will be omitted.

Then, the behavioral synthesis unit 300 carries out behavioral synthesis so that parallelism is increased (step S304). Herein, the behavior level description including no label except for a top label is supplied to the behavioral synthesis unit 300. When the description is such a behavior level description, an RTL description having high parallelism can be generated. Note that, since the behavioral synthesis executed by the behavioral synthesis unit 300 is disclosed in, for example, Non-Patent Literature 1, the explanation thereof will be omitted herein.

When the behavioral synthesis unit 300 completes the behavioral synthesis, the behavioral synthesis process is completed.

According to the description processing device 102 according to the present embodiment, further improvement of the parallelism of an electronic circuit generated by the behavior level description can be expected.

In the above described first embodiment, as long as a label statement can be extracted in step S109, execution of deletion (replacement) of the extracted label is continued. In other words, as an end condition of the repetition, that no more label statement can be extracted is employed. However, as the end condition, another condition can be selected. For example, when the number of times of repetition reaches a predetermined upper limit, the repetition may be finished regardless whether a label statement can be extracted or not. Other than this, it is also possible to check the parallelism that is obtained when the RTL description is generated from the output behavior level description and stop deleting the extracted label when it reaches a predetermined upper limit. These upper limits may be input by a user as parameters or may be stored in a memory device, in advance. The same applies to step S207 of the second embodiment.

In the present embodiments, a top part of functions is employed as the "top" of the behavior level description; however, other than this, the "top" can be determined in the below manners. Specifically, for example, all functions are subjected to in-line expansion, and the top of all of them is used as the "top"; an outermost start position of a multiple loop is used as the "top"; the "top" is arbitrarily disposed, for example, in the middle of functions by a user; and the statements of the behavior level description are divided by a certain number, and the "top" is disposed for each of the divisions. This is for the reason that essence of the present invention resides in organization of a plurality of labels into one.

Furthermore, to determine a "top" to organize such labels, a method which generates an RTL description and selects an optimal one from among a plurality of candidates in accordance with the parallelism thereof and limitation of the area of a circuit can be employed. When the labels are organized at an earlier part as much as possible, parallelism is correspondingly increased; however, since required computing devices are also increased, they are in the relation of tradeoff.

In the above described embodiments, the explanations have been given on the assumption that programs are stored in the memory device in advance. However, the programs for operating the description processing devices as the entirety or part of a device or for executing the above described processes may be distributed in the state that they are stored in a computer-readable recording medium such as a CD-ROM (Compact Disk Read-Only Memory), DVD (Digital Versatile Disk), or MO (Magneto Optical Disk); and these programs may be installed to another computer so as to be operated as means of the above description or caused to execute above described steps.

Furthermore, the programs may be stored in, for example, a disk device owned by a server device on the Internet, and the programs may be executed by, for example, by downloading the programs to a computer by, for example, superimposing the programs on a carrier wave.

As described above, according to the present invention, description processing devices, description processing methods suitable for converting behavior level description for designing electronic circuits and increasing parallelism and a recording medium recording programs for realizing them on a computer, can be provided.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A description processing device for deleting a label statement from a behavior level description described by a column of, at least, an operation/assignment statement executing an operation and/or assignment, a conditional executable statement enclosing and specifying a statement to be executed when a condition is satisfied, a label statement declaring a label, and a jump statement causing a jump to the label, the description processing device comprising:

a receiving unit receiving input of the behavior level description serving as a processing target;

a label-name generating unit generating a new label name;

a label disposing unit disposing a label statement using the generated new label name (hereinafter, referred to as the "top label statement") at a top of the received behavior level description;

an extracting unit extracting one label statement (hereinafter, referred to as the "extracted label statement") not enclosed by the conditional executable statement among the statements of the received behavior level description;

a variable-name generating unit generating a new variable name associated with the extracted label statement;

a replacing unit replacing a statement immediately below the top label statement to the extracted label statement by a column of a conditional executable statement executing the statement immediately below the top label statement to immediately above the extracted label statement when a value of the variable of the generated variable name is a first value and an operation/assignment statement assigning the first value to the variable of the generated variable name in the input and received behavior level description, and replacing the jump statement causing a jump to the label of the extracted label statement by a column of an operation/assignment statement assigning a second value to the variable of the generated variable name and a jump statement causing a jump to the top label;

a control unit repeating the extraction by the extracting unit, the generation of a new variable name by the variable-name generating unit, and the replacement by the replacing unit until a predetermined end condition is satisfied;

an inserting unit inserting an operation/assignment statement initializing the each variable of generated variable name to the first value into a part immediately above the label statement using the top label name in a result obtained by last replacement in the repetition; and an output unit outputting the behavior level description which is a result of the insertion.

2. A description processing device for moving a label statement of a behavior level description described by a column of, at least, an operation/assignment statement executing an operation and/or assignment, a conditional executable statement enclosing and specifying a statement to be executed when a condition is satisfied, a label statement declaring a label, and a jump statement causing a jump to the label, the description processing device comprising:

a receiving unit receiving input of the behavior level description serving as a processing target;

an extracting unit extracting one label statement (hereinafter, referred to as the "extracted label statement") enclosed by the conditional executable statement among the statements of the received behavior level description;

a variable-name generating unit generating a new variable name associated with the extracted label statement;

a replacing unit replacing the first conditional executable statement enclosing the extracted label statement in the input and received behavior level description by a column of:

(1) an assignment statement assigning a first value to the variable of the generated variable name, (2) the extracted label statement, and (3) a second conditional executable statement enclosing statements to be executed when a condition expression of the first conditional executable statement is satisfied or when the variable of the generated variable name is a second value, the enclosed statements being a second conditional executable statement which is a column of:

(a) a third conditional executable statement executing a statement above the extracted label statement among statements enclosed by the first conditional executable statement when the variable of the generated variable name is the first value, (b) an assignment statement of assigning the first value to the variable of the generated variable name, and (c) a statement below the extracted label statement among the statements enclosed by the first conditional executable statement, and replacing the jump statement causing a jump to the label of the extracted label statement by a column of an operation/assignment statement assigning the second value to the variable of the generated variable name and a jump statement causing a jump to the label of the extracted label statement;

a control unit repeating the extraction by the extracting unit, the generation of a new variable name by the variable-name generating unit, and the replacement by the replacing unit until a predetermined end condition is satisfied; and an output unit outputting the behavior level description which is a result obtained by last replacement in the repetition.

3. A description processing device which gives the behavior level description output from the description processing device according to claim 2 to the description processing device according as input.

4. The description processing device according to claim 1, wherein the predetermined end condition is satisfied when no more label statement can be extracted by the extracting unit.

5. The description processing device according to claim 1, wherein the predetermined end condition is satisfied when the number of times of the repetition reaches a predetermined number of times.

6. A description processing method for deleting a label statement from a behavior level description described by a column of, at least, an operation/assignment statement executing an operation and/or assignment, a conditional executable statement enclosing and specifying a statement to be executed when a condition is satisfied, a label statement declaring a label, and a jump statement causing a jump to the label, the description processing method executed by a description processing device comprising a receiving unit, a label-name generating unit, a label disposing unit, an extracting unit, a variable-name generating unit, a replacing unit, a control unit, an inserting unit, and an output unit, the description processing method comprising:

a receiving step of receiving input of the behavior level description serving as a processing target by the receiving unit;

a label-name generating step of generating a new label name by the label-name generating unit;

a label disposing step of disposing a label statement using the generated new label name (hereinafter, referred to as the "top label statement") at a top of the received behavior level description by the label disposing unit;

an extracting step of extracting one label statement (hereinafter, referred to as the "extracted label statement") not enclosed by a conditional executable statement among the statements of the received behavior level description by the extracting unit;

a variable-name generating step of generating a new variable name associated with the extracted label statement by the variable-name generating unit;

a replacing step of replacing a statement immediately below the top label statement to the extracted label statement by a column of a conditional executable statement executing the statement immediately below the top label statement to a statement immediately above the extracted label statement when the value of a variable of the generated variable name is a first value and an operation/assignment statement assigning the first value to the variable of the generated variable name in the input and received behavior level description, and replacing the jump statement causing a jump to the label of the extracted label statement by a column of an operation/assignment statement assigning a second value to the variable of the generated variable name and a jump statement causing a jump to the top label by the replacing unit;

a control step of repeating the extraction by the extracting unit, the generation of a new variable name by the variable-name generating unit, and the replacement by the replacing unit until a predetermined end condition is satisfied by the control unit;

an inserting step of inserting an operation/assignment statement initializing each variable of the generated variable name to the first value into a part immediately above the label statement using the top label name in a result obtained by last replacement in the repetition by the inserting unit; and an output step of outputting the behavior level description which is a result of the insertion by the output unit.

7. A description processing method for moving a label statement of a behavior level description described by a column of, at least, an operation/assignment statement executing an operation and/or assignment, a conditional executable statement enclosing and specifying a statement to be executed when a condition is satisfied, a label statement declaring a label, and a jump statement causing a jump to the label, the description processing method executed by a description processing device comprising a receiving unit, an extracting unit, a variable-name generating unit, a replacing unit, a control unit, and an output unit, the description processing method comprising:

a receiving step of receiving input of the behavior level description serving as a processing target by the receiving unit;

an extracting step of extracting one label statement (hereinafter, referred as the "extracted label statement") enclosed by a conditional executable statement among the statements of the received behavior level description by the extracting unit;

a variable-name generating step of generating a new variable name associated with the extracted label statement by the variable-name generating unit;

a replacing step of replacing the first conditional executable statement enclosing the extracted label statement in the input and received behavior level description by a column of:

(1) an assignment statement assigning a first value to the variable of the generated variable name, (2) the extracted label statement, and (3) a second conditional executable statement enclosing statements to be executed when a condition expression of the first conditional executable statement is satisfied or when the variable of the generated variable name is a second value, the enclosed statements being a second conditional executable statement which is a column of:

(a) a third conditional executable statement executing a statement above the extracted label statement among statements enclosed by the first conditional executable statement when the variable of the generated variable name is the first value, (b) an assignment statement of assigning the first value to the variable of the generated variable name, and (c) a statement below the extracted label statement among the statements enclosed by the first conditional executable statement, and replacing the jump statement causing a jump to the label of the extracted label statement by a column of an operation/assignment statement assigning the second value to the variable of the generated variable name and a jump statement causing a jump to the label of the extracted label statement by the replacing unit;

a control step of repeating the extraction by the extracting unit, the generation of a new variable name by the variable-name generating unit, and the replacement by the replacing unit until a predetermined end condition is satisfied by the control unit; and an output step of outputting the behavior level description, which is a result obtained by last replacement in the repetition, by the output unit.

8. A non-transitory recording medium recording a program for causing a computer to function as a description processing device for deleting a label statement from a behavior level description described by a column of, at least, an operation/assignment statement executing an operation and/or assignment, a conditional executable statement enclosing and specifying a statement to be executed when a condition is satisfied, a label statement declaring a label, and a jump statement causing a jump to the label, the recording medium recording the program causing the computer to function as:

a receiving unit receiving input of the behavior level description serving as a processing target;

a label-name generating unit generating a new label name;

a label disposing unit disposing a label statement using the generated new label name (hereinafter, referred to as the "top label statement") at a top of the received behavior level description;

an extracting unit extracting one label statement (hereinafter, referred to as the "extracted label statement") not enclosed by the conditional executable statement among the statements of the received behavior level description;

a variable-name generating unit generating a new variable name associated with the extracted label statement;

a replacing unit replacing a statement immediately below the top label statement to the extracted label statement by a column of a conditional executable statement executing the statement immediately below the top label statement to immediately above the extracted label statement when the value of a variable of the generated variable name is a first value and an operation/assignment statement assigning the first value to the variable of the generated variable name in the input and received behavior level description, and replacing the jump statement causing a jump to the label of the extracted label statement by a column of an operation/assignment statement assigning a second value to the variable of the generated variable name and a jump statement causing a jump to the top label;

a control unit repeating the extraction by the extracting unit, the generation of a new variable name by the variable-name generating unit, and the replacement by the replacing unit until a predetermined end condition is satisfied;

an inserting unit inserting an operation/assignment statement initializing each variable of the generated variable name to the first value into a part immediately above the label statement using the top label name in a result obtained by last replacement in the repetition; and an output unit outputting the behavior level description which is a result of the insertion.

9. A non-transitory recording medium recording a program for causing a computer to function as a description processing device for moving a label statement of a behavior level description described by a column of, at least, an operation/assignment statement executing an operation and/or assignment, a conditional executable statement enclosing and specifying a statement to be executed when a condition is satisfied, a label statement declaring a label, and a jump statement causing a jump to the label, the program causing the computer to function as:

- a receiving unit receiving input of the behavior level description serving as a processing target;
- an extracting unit extracting one label statement (hereinafter, referred as the "extracted label statement") enclosed by the conditional executable statement among the statements of the received behavior level description;
- a variable-name generating unit generating a new variable name associated with the extracted label statement;
- a replacing unit replacing the first conditional executable statement enclosing the extracted label statement in the input and received behavior level description by a column of:
  (1) an assignment statement assigning a first value to a variable of the generated variable name,
  (2) the extracted label statement, and
  (3) a second conditional executable statement enclosing statements to be executed when a condition expression of the first conditional executable statement is satisfied or when the variable of the generated variable name is a second value, the enclosed statements being a second executable statement which is a column of:
  (a) a third conditional executable statement executing a statement above the extracted label statement among statements enclosed by the first conditional executable statement when the variable of the generated variable name is the first value,
  (b) an assignment statement of assigning the first value to the variable of the generated variable name, and
  (c) a statement below the extracted label statement among the statements enclosed by the first conditional executable statement,
  and replacing the jump statement causing a jump to the label of the extracted label statement by a column of an operation/assignment statement assigning the second value to the variable of the generated variable name and a jump statement causing a jump to the label of the extracted label statement;
- a control unit repeating the extraction by the extracting unit, the generation of a new variable name by the variable-name generating unit, and the replacement by the replacing unit until a predetermined, end condition is satisfied; and
- an output unit outputting the behavior level description which is a result obtained by last replacement in the repetition.

* * * * *